United States Patent
Ahn et al.

(10) Patent No.: US 7,888,785 B2
(45) Date of Patent: Feb. 15, 2011

(54) SEMICONDUCTOR PACKAGE EMBEDDED IN SUBSTRATE, SYSTEM INCLUDING THE SAME AND ASSOCIATED METHODS

(75) Inventors: Eun-Chul Ahn, Yongin-Si (KR); Min-Ho O, Taegu-Si (KR); Jong Ho Lee, Asan-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/219,263

(22) Filed: Jul. 18, 2008

(65) Prior Publication Data

US 2009/0065920 A1 Mar. 12, 2009

(30) Foreign Application Priority Data

Sep. 6, 2007 (KR) ...................... 10-2007-0090563

(51) Int. Cl.
*H01L 23/02* (2006.01)

(52) U.S. Cl. ...................................... 257/686; 257/777
(58) Field of Classification Search ................. 257/686, 257/777, 723, 724, 500, 501, 506, 508, 510
See application file for complete search history.

(56) References Cited

U.S. PATENT DOCUMENTS

| 3,368,113 | A | * | 2/1968 | Shaunfield | 257/508 |
| 3,431,468 | A | * | 3/1969 | Huffman | 257/508 |
| 3,440,498 | A | * | 4/1969 | Mitchell | 257/524 |
| 5,241,456 | A | * | 8/1993 | Marcinkiewicz et al. | 361/792 |
| 6,943,443 | B2 | * | 9/2005 | Nobori et al. | 257/704 |
| 7,087,991 | B2 |   | 8/2006 | Chen et al. |   |
| 7,205,674 | B2 | * | 4/2007 | Huang et al. | 257/787 |

* cited by examiner

*Primary Examiner*—S. V Clark
(74) *Attorney, Agent, or Firm*—Lee & Morse, P.C.

(57) ABSTRACT

A device includes a base substrate, a package including an encapsulated die, the package at least partially embedded in the base substrate, and a wiring portion on the package and extending across at least a portion of the base substrate adjacent to the package.

19 Claims, 7 Drawing Sheets

SEMICONDUCTOR PACKAGE EMBEDDED IN SUBSTRATE, SYSTEM INCLUDING THE SAME AND ASSOCIATED METHODS

BACKGROUND OF THE INVENTION

1. Field of the Invention

Embodiments relate to a semiconductor package embedded in a substrate, a system including the same and associated methods.

2. Description of the Related Art

Continuing development of electronic devices requires advances in packaging to enable the manufacture of reliable, compact, high performance devices. Further, cost-effective manufacturing of such devices depends on the ability to employ economical materials, and manufacturing processes that are robust and provide high yields. There are a wide variety of packages that have been developed. Existing packages, however, may not fulfill all of the above-described requirements for next-generation devices.

SUMMARY OF THE INVENTION

Embodiments are therefore directed to a semiconductor package embedded in a substrate, a system including the same and associated methods, which substantially overcome one or more of the problems due to the limitations and disadvantages of the related art.

It is therefore a feature of an embodiment to provide a semiconductor package embedded in a substrate, a system including the same and associated methods that enable the testing of a packaged die before final assembly thereof with the substrate.

It is therefore another feature of an embodiment to provide a semiconductor package embedded in a substrate, a system including the same and associated methods that enable the use of multiple dies in a single package embedded in the substrate.

It is therefore another feature of an embodiment to provide a semiconductor package embedded in a substrate, a system including the same and associated methods that reduce a mismatch in coefficients of thermal expansion between a die in the package and the substrate.

At least one of the above and other features and advantages may be realized by providing a device, including a base substrate, a package including an encapsulated die, the package at least partially embedded in the base substrate, and a wiring portion on the package and extending across at least a portion of the base substrate adjacent to the package.

A wiring layer in the wiring portion may be electrically connected to the package. The base substrate may have a cavity therein that is at least as large as the encapsulated die, the wiring portion may further include an insulating material disposed on the bottom surface of the package, the bottom surface facing away from the cavity, and the insulating material may be disposed in the cavity in a space between the encapsulated die and the sidewalls of the base substrate. The package may be embedded in the base substrate in a bottom-up orientation, such that an active side of the die faces the wiring portion, and the wiring layer may be electrically connected to bonding pads on the bottom of the package.

The wiring portion may include a plurality of openings aligned with bonding pads on the bottom of the package, and a conductive material disposed in the openings and electrically connecting the bonding pads to the wiring layer. The wiring portion may include a metal pattern electrically connecting bonding pads on the bottom of the package to the wiring layer, and a solder resist covering the metal pattern, the solder resist forming an exposed surface of the device.

The device may further include a least one wiring layer embedded in the base substrate below the wiring portion, the wiring portion electrically connecting the at least one wiring layer to the package. The device may further include another die in the package, the other die being stacked on the die and electrically connected to the wiring portion. The device may further include a second package embedded in the base substrate, and the wiring portion may be electrically connected to the package and the second package. The device may further include a second package disposed between the wiring portion and the package.

The device may further include another die disposed on the package. An insulation layer may cover the other die and the package, and a wiring pattern may be formed on the insulation layer and may be electrically connected to the other die and the package. The package may include a plurality of peripheral bonding pads in a peripheral region thereof, and the other die may be disposed in an area bounded by the peripheral bonding pads. The insulation layer may include openings aligned with the peripheral bonding pads, and a conductive material may be disposed in the openings and may electrically connect the peripheral bonding pads to a wiring layer in the wiring portion. The wiring portion may be between the other die and the package. The other die may be connected to the wiring portion by bond wires attached to an upper side of the other die.

The device may further include a second package, the wiring portion may be disposed between the second package and the package, and the second package may be connected to the wiring portion by solder bumps disposed on a lower side of the second package. The package may be embedded in a cavity in the base substrate, and the cavity may have a height that is less than a height of the base substrate. The package may be embedded in a cavity in the base substrate, and the cavity may extend through an entire thickness of the base substrate. The device may further include a layer on a lower side of the base substrate, the layer extending across the cavity so as to enclose a lower portion of the cavity. The die may be fixed to a substrate, and the die and the substrate may both be encapsulated in the package.

At least one of the above and other features and advantages may also be realized by providing a method of fabricating an electronic device, including embedding a package in a base substrate, the package including an encapsulated die, and forming a wiring portion on the package and extending across at least a portion of the base substrate adjacent to the package. The package may be at least partially embedded in the base substrate.

At least one of the above and other features and advantages may also be realized by providing an electronic system, including a die including a memory, and a processor interfaced with the memory. The die may be encapsulated in a package that is at least partially embedded in a base substrate, and a wiring portion may be on the package and may extend across at least a portion of the base substrate adjacent to the package.

BRIEF DESCRIPTION OF THE DRAWINGS

The above and other features and advantages will become more apparent to those of ordinary skill in the art by describing in detail example embodiments thereof with reference to the attached drawings, in which.

DETAILED DESCRIPTION OF THE INVENTION

Figure 1:
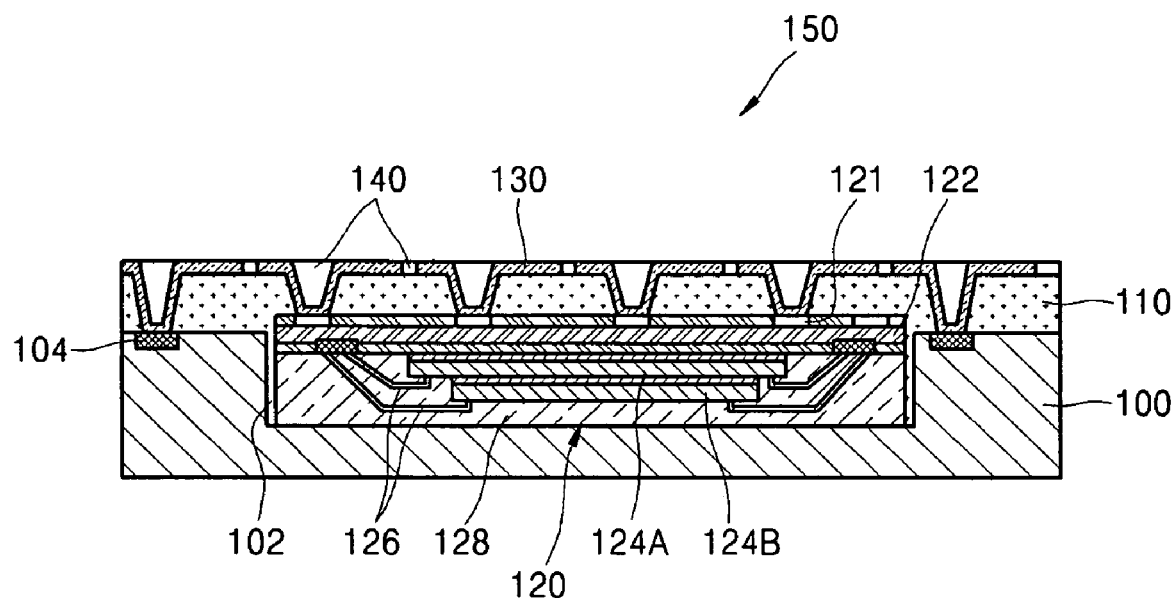
FIG. 1 illustrates a semiconductor package embedded in a substrate according to a first embodiment.

Korean Application No. 10-2007-0090563, filed on Sep. 6, 2007, in the Korean Intellectual Property Office, and entitled "Semiconductor Package Embedded Circuit Board," is incorporated by reference herein in its entirety.

Embodiments will now be described more fully hereinafter with reference to the accompanying drawings; however, they should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Where an element is described as being connected to a second element, the element may be directly connected to second element, or may be indirectly connected to second element via one or more other elements. Further, where an element is described as being connected to a second element, it will be understood that the elements may be electrically connected, e.g., in the case of transistors, capacitors, power supplies, nodes, etc. In the figures, the dimensions of regions may be exaggerated and elements may be omitted for clarity of illustration. Like reference numerals refer to like elements throughout.

FIG. 1 illustrates a semiconductor package embedded in a substrate according to a first embodiment. Referring to FIG. 1, reference numeral 150 indicates a package/substrate assembly, the assembly 150 including a semiconductor package 120 embedded in a substrate 100.

The semiconductor package 120 illustrated in FIG. 1 includes a stack of two dies, or chips, 124A and 124B (in the context of the embodiments described herein, the term "die" and the term "chip" are used interchangeably). This two-die implementation is provided to describe the features of the assembly 150 in a complete and clear manner. It will be appreciated, however, that in addition to the illustrated two-die implementation, one die, or three or more dies, may be used. Further, it will be appreciated that multiple dies may be stacked in the package 120, disposed side-by-side in the package 120, or a mixture thereof.

The semiconductor package 120 may include the dies 124A and 124B, which may be connected using, e.g., wire bonds 126, to conductive features, e.g., pads, that are exposed on a first surface of a package substrate 122, which faces downward in FIG. 1. In an implementation, active surfaces of the dies 124A and 124B may face away from the first surface of the package substrate 122, i.e., they may face downward in FIG. 1. The dies 124A and 124B in the semiconductor package 120 may be encapsulated by an encapsulant 128, e.g., epoxy molding compound (EMC), etc.

The package substrate 122 may include conductive traces on the first and second surfaces thereof, as well as within the package substrate 122, e.g., on layers internal to the package substrate 122, in order to connect pads 121 on the second surface to the wire bonds 126 on the opposite surface, i.e., first surface, and/or to redistribute wiring from one region of the package substrate 122 to another region thereof. The conductive pads 121 may be provided on the second surface of the package substrate 122, which faces upward in FIG. 1. The conductive pads 121 may be, e.g., solder ball pads. As described below, however, conventional solder balls may be replaced with more direct connections to the next-level substrate.

The substrate 100 may have a cavity 102 therein having a size that is greater that that of the semiconductor package 120 so as to accommodate the semiconductor package 120 in a recessed manner. The cavity 102 may have a height that is less than that of the semiconductor package 120 so that the semiconductor package 120 projects above a surface of the substrate 100, as shown in FIG. 1, or the cavity 102 may have a height that is equal to or greater than that of the semiconductor package 120. An insulating layer 110 may cover the semiconductor package 120. Interstitial spaces between sidewalls of the cavity 102 and the semiconductor package 120 may be filled by the material used for the insulating layer 110, an adhesive material, a combination thereof, etc. In an implementation, the adhesive material or the material used for the insulating layer 110 may also be disposed between a major surface of the substrate 100 that defines the bottom of the cavity 102 and the semiconductor package 120, such that the material used for the insulating layer 110 completely surrounds the semiconductor package 120. The adhesive material may include, e.g., a pre-preg material, a substrate raw material, etc.

The substrate 100 may include one or more circuit patterns 104 therein. Openings, e.g., vias, trenches, etc., may be formed in the insulating layer 110 to allow a metal pattern 130 to be connected to the pads 121 and/or the circuit pattern 104. Additional insulating and metal pattern layers (not shown) may be additionally formed on the insulating layer 110 and metal pattern 130. A solder resist 140 may be formed on regions of the insulating layer 110 and the metal pattern 130.

The substrate 100 may include one or more layers of, e.g., an insulating material such as FR4, BT resin, etc., and may further include conductive layers, e.g., metal traces, ground and power planes, etc. The insulating layer 110 covering the semiconductor package 120 may be a resin, e.g., BT resin, etc.

The assembly 150 according to the first embodiment may afford a number of advantages as compared to alternative techniques for packaging dies. For example, two or more dies, e.g., two dies 124A and 124B in a stack, may be included in the assembly 150. Accordingly, a higher level of integration may be achieved as compared with, e.g., embedding a bare die in a substrate.

The assembly 150 may also allow a die or dies to be encapsulated in the package 120 and tested in the packaged state before being assembled with the substrate 100, which may result in improved yields by reducing the likelihood that the finished assembly 150 will include a defective die. For example, a greater range of tests such as speed tests, etc., may be performed on the package 120 prior to assembly thereof with the substrate 100, as compared the range of tests that can be performed on a wafer or a bare die. Further, the encapsulation of the package 120 serves to protect the die or dies within the package. Accordingly, processing of the assembly 150 may be performed using techniques that would not be conducive to the use of bare dies, i.e., unpackaged dies. In this regard, processing of the substrate 100 may involve the use of chemicals that may damage a bare die, and/or may involve the production of contaminants that may damage a bare die. Thus, the use of the package 120 may provide for improved yields while enabling the use of a broader range of substrate processing techniques as compared to those that may be used with a bare die.

The assembly 150 may also provide enhanced reliability against failures due to coefficient of thermal expansion (CTE) mismatches. In this regard, it is well known that the CTE of a die may be significantly less than the CTE of a substrate, particularly an organic substrate such as an FR-4-based substrate. The assembly 150 provides the package substrate 122, which may have a CTE between that of the dies 124A and the substrate 100. Accordingly, the harmful effects of CTE mismatch may be reduced or eliminated.

Still other advantages may flow from the ability of the package substrate 122 to serve as a redistribution wiring layer, which may simplify assembly and improve reliability by transitioning between a fine pitch of pads on the die to a relatively larger pitch of the metal pattern 130. For example, the pitch of features in the metal pattern 130 may be those of a printed circuit board (PCB), e.g., about 500 µm, whereas the pitch of features on the surface of the dies 124A and 124B may be, e.g., about 50 µm. The use of the package substrate 122 as a redistribution layer may allow the use of a greater variety of processing techniques, e.g., less precise, more reliable and more economical techniques, for formation of the metal pattern 130. Additionally, as shown in FIG. 1, wire bonding may be used for connections to the dies 124A and 124B. In contrast, a bare die embedded in a substrate may rely upon direct connections between the die pads and the next-level conductive layer, which may be more difficult to manufacture and more prone to failure.

Figure 2:
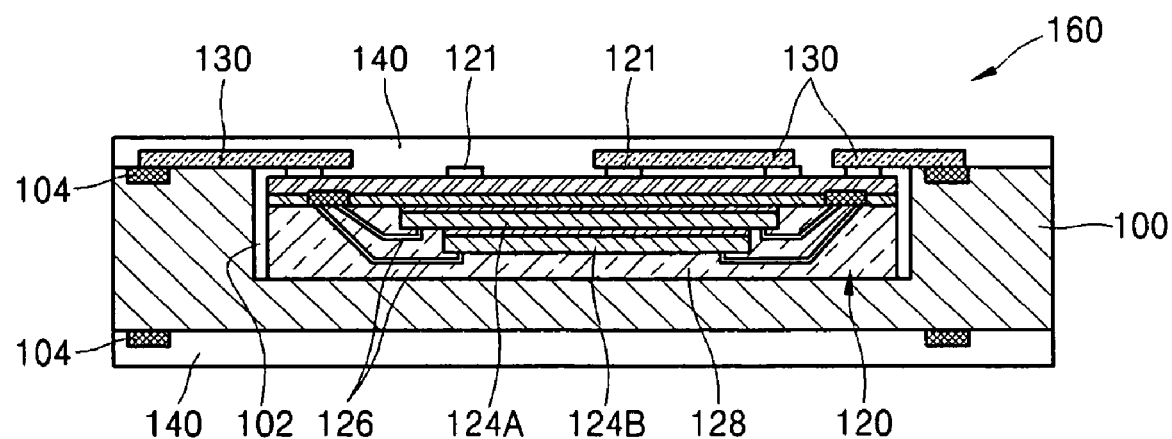
FIG. 2 illustrates a semiconductor package embedded in a substrate according to a second embodiment.

Advantages such as those set forth above may also be provided by additional embodiments, which will now be described. FIG. 2 illustrates a semiconductor package embedded in a substrate according to a second embodiment. In the description of the second embodiment and the embodiments that follow, the description of features that are the same as those in the first embodiment may be omitted in order to avoid repetition.

Referring to FIG. 2, reference number 160 indicates a package/substrate assembly including the semiconductor package 120 embedded in the substrate 100. As illustrated in FIG. 2, a metal pattern 130' may be formed without the insulating layer 110 thereunder, which may reduce the overall height of the assembly 160.

In an implementation, the substrate 100 may include the circuit pattern 104 on both sides of the substrate, and may further include the solder resist 140 on both sides of the substrate, as shown in FIG. 2. Such a configuration may increase the number of options for the routing of wiring and mounting of other active or passive devices.

Figure 3:
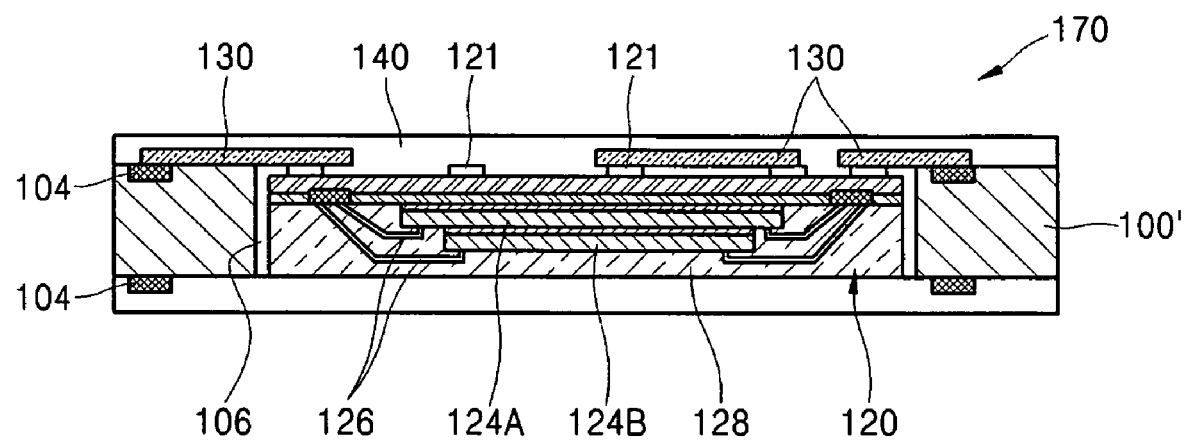
FIG. 3 illustrates a semiconductor package embedded in a substrate according to a third embodiment.

FIG. 3 illustrates a semiconductor package embedded in a substrate according to a third embodiment. Referring to FIG. 3, reference number 170 indicates a package/substrate assembly including the semiconductor package 120 embedded in a substrate 100'. As illustrated in FIG. 3, the substrate 100' may have an opening 106 penetrating therethrough in which the semiconductor package 120 is disposed, which may reduce the overall height of the assembly 170 as compared to the first and second embodiments wherein the cavity 102 does not extend through the substrate 100. An adhesive material may bond the sides of the semiconductor package 120 to sidewalls of the opening 106.

Figure 4:
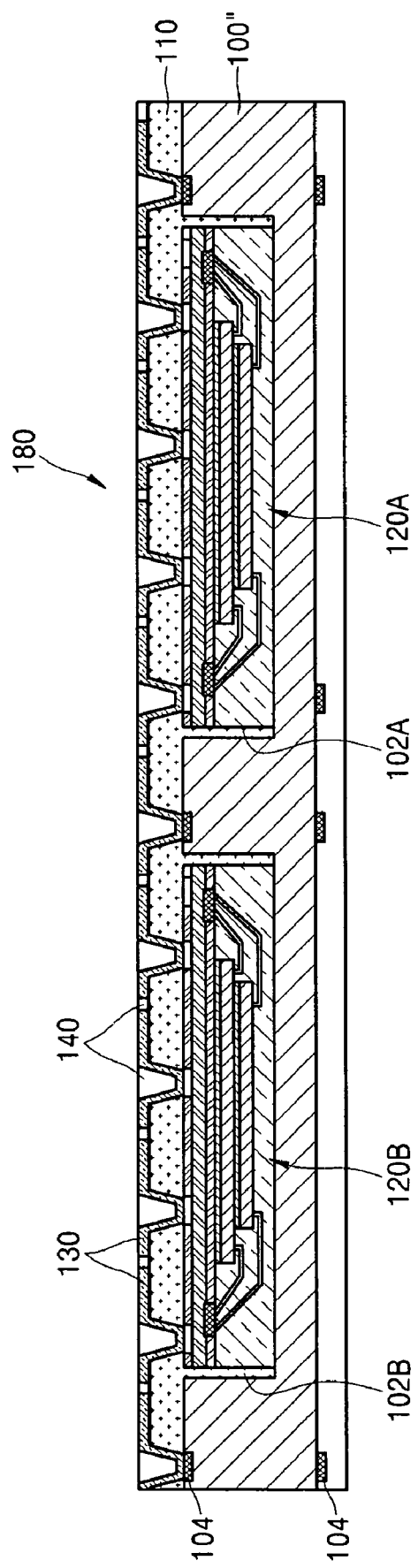
FIG. 4 illustrates a plurality of semiconductor packages embedded in a substrate according to a fourth embodiment.

FIG. 4 illustrates a plurality of semiconductor packages embedded in a substrate according to a fourth embodiment. Referring to FIG. 4, reference number 180 indicates a package/substrate assembly including two semiconductor packages 120A and 120B embedded in respective openings 102A and 102B in a substrate 100". According to the fourth embodiment, the degree of integration of the assembly 180 may be increased as compared to the first through third embodiments described above, which may be desirable for, e.g., a memory module. Additionally, the assembly 180 may enable assembly of devices performing a greater variety of functions, e.g., signal processing, data processing and/or storage (memory). Thus, the assembly 180 may be particularly useful for system-in-package (SIP) implementations.

Figure 5:
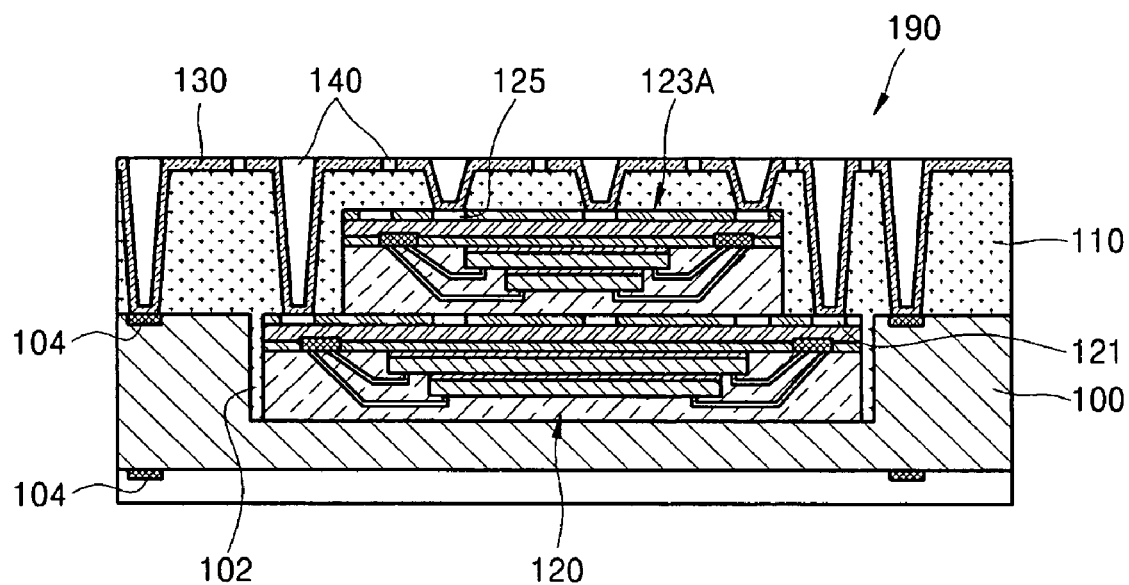
FIG. 5 illustrates a plurality of semiconductor packages integrated with a substrate according to a fifth embodiment.

FIG. 5 illustrates a plurality of semiconductor packages integrated with a substrate according to a fifth embodiment. Referring to FIG. 5, reference number 190 indicates a package/substrate assembly including the semiconductor package 120 embedded in the substrate 100 and stacked with a second semiconductor package 123A. The second semiconductor package 123A may be bonded to the semiconductor package 120. Such bonding may be achieved using, e.g., a liquid or film-type adhesive.

In the assembly 190, one or more lateral dimensions of the second semiconductor package 123A may be smaller than the corresponding dimension(s) of the semiconductor package 120, and the semiconductor package 120 may be designed so that the conductive pads 121 are located in peripheral regions of the package. Accordingly, the conductive pads 121 may be exposed, i.e., not covered, by the second semiconductor package 123A. The semiconductor packages 120, 123A may be covered by the insulation layer 110. The metal pattern 130 may extend through the insulation layer 100 to contact the conductive pads 121 of the semiconductor package 120, as well as to contact conductive pads 125 of the second semiconductor package 123A, which may face upward. Thus, the metal pattern 130 may connect the semiconductor packages 120 and 123A to one another, as well as to the circuit pattern 104 at the corresponding surface of the substrate 100.

By enabling the use of a plurality of semiconductor packages, the fifth embodiment may provide advantages similar to those set forth above in connection with the fourth embodiment. The assembly 190 of the fifth embodiment may also reduce the overall lateral dimensions of the assembly as compared to embedding a plurality of chips side-by-side, e.g., as in the fourth embodiment. Further, the assembly 190 may permit the use of shorter interconnections between semiconductor packages, which may improve signal quality, etc.

Figure 6:
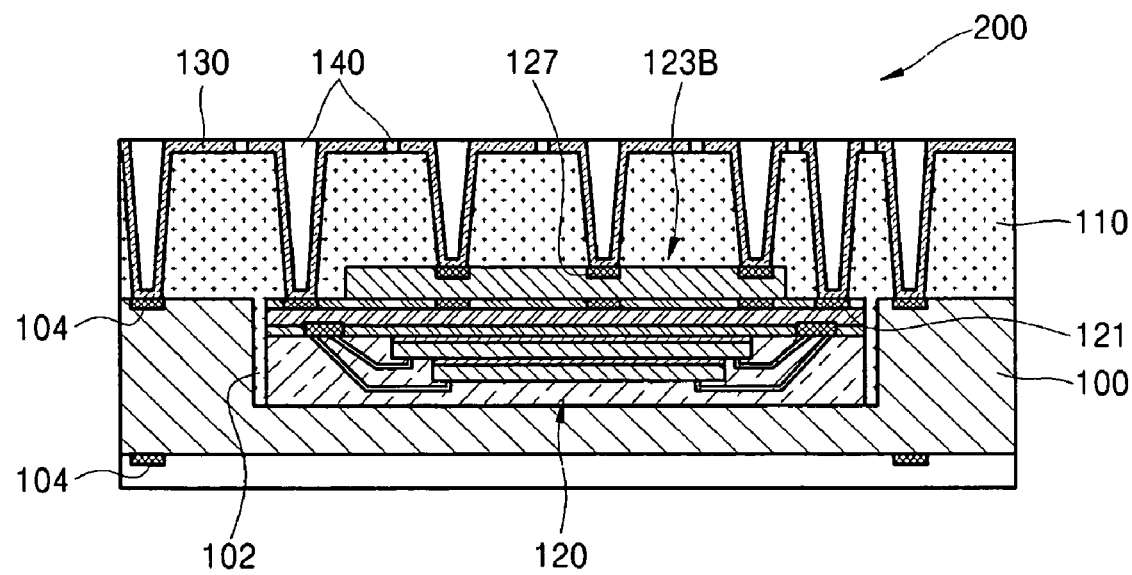
FIG. 6 illustrates a semiconductor package embedded in a substrate and integrated with a die according to a sixth embodiment.

FIG. 6 illustrates a semiconductor package embedded in a substrate and integrated with a die according to a sixth embodiment. Referring to FIG. 6, reference number 200 indicates a package/substrate assembly including the semiconductor package 120 embedded in the substrate 100 and stacked with a semiconductor die 123B. The semiconductor die 123B may be bonded to the semiconductor package 120. Such bonding may be achieved using, e.g., a liquid or film-type adhesive. In an implementation, the semiconductor package 120 may be tested, e.g., using speed tests, etc., prior to incorporation thereof into the assembly 200, while the semiconductor die may have the speed tests, etc., performed thereon after incorporation into the assembly 200.

In the assembly 200, one or more lateral dimensions of the semiconductor die 123B may be smaller than the corresponding dimension(s) of the semiconductor package 120, and the semiconductor package 120 may be designed so that the conductive pads 121 are located in peripheral regions of the semiconductor package 120. Accordingly, the conductive pads 121 may be exposed, i.e., not covered, by the semiconductor die 123B. The semiconductor package 120 and the die 123B may be covered by the insulation layer 110. The metal pattern 130 may extend through the insulation layer 100 to contact the conductive pads 121 of the semiconductor package 120, as well as bond pads 127 of the semiconductor die 123B, which may be disposed on the upper surface of the semiconductor die 123B. Thus, the metal pattern 130 may connect the semiconductor package 120 and the semiconductor die 123B to one another, as well as to the circuit pattern 104 at the corresponding surface of the substrate 100.

Figure 7:
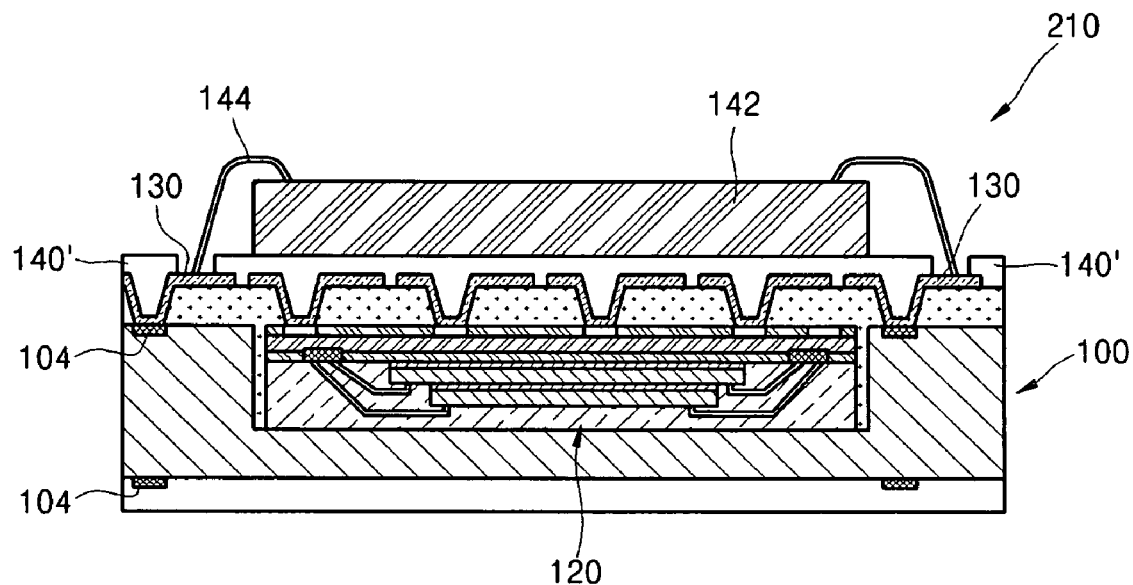
FIG. 7 illustrates a semiconductor package embedded in a substrate and integrated with a die according to a seventh embodiment.

FIG. 7 illustrates a semiconductor package embedded in a substrate and integrated with a die according to a seventh embodiment. Referring to FIG. 7, reference number 210 indicates a package/substrate assembly including the semiconductor package 120 embedded in the substrate 100 and stacked with a die 142. The die 142 may be bonded at an exposed surface of the assembly 210, e.g., on a solder resist 140'. Such bonding may be achieved using, e.g., a liquid or film-type adhesive. A thickness of the solder resist 140' may be increased to provide a surface more conducive to bonding. Further, openings may be provided in the solder resist 140' to enable connections between the die 142 to be electrically connected to the metal layer 130 using conductive wires 144. In another implementation (not shown), the die 142 may be bonded to exposed pads or portions of the metal layer 130 using a flip-chip or similar arrangement.

In the assembly 210, lateral dimensions of the die 142 may extend beyond those of the semiconductor package 120. Thus, the seventh embodiment may provide greater design flexibility with respect to the die 142. Further, mounting the die 142 on the exposed surface of the assembly 210 may be useful for a larger variety of dies 142, e.g., dies 142 including sensors such as CMOS sensors, etc., which are not to be covered by the insulation layer 110, metal pattern 130 and solder resist 140'.

Figure 8:
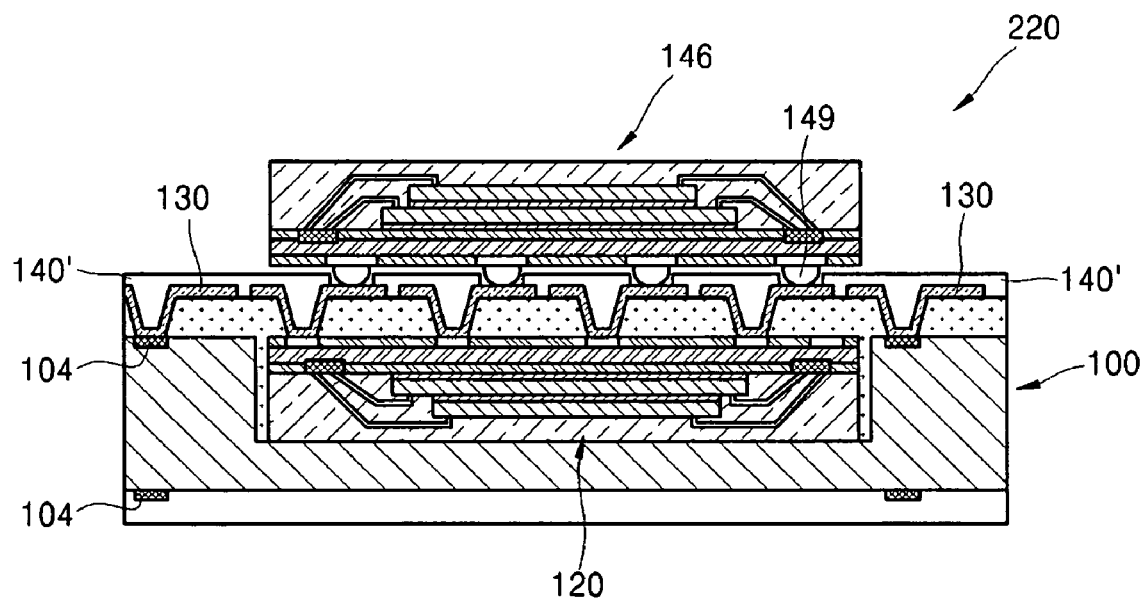
FIG. 8 illustrates a semiconductor package embedded in a substrate and integrated with a second semiconductor package according to an eighth embodiment.

FIG. 8 illustrates a semiconductor package embedded in a substrate and integrated with a second semiconductor package according to an eighth embodiment. Referring to FIG. 8, reference number 220 indicates a package/substrate assembly including the semiconductor package 120 embedded in the substrate 100 and stacked with a second semiconductor package 146. In similar fashion to the seventh embodiment, the second semiconductor package 146 may be attached to an exposed surface of the assembly 220. Openings in the solder resist 140' may allow solder balls 149 to connect the second semiconductor package 146 to the metal pattern 130.

In the assembly 220, lateral dimensions of the second semiconductor package 146 may extend beyond those of the semiconductor package 120. Thus, the eighth embodiment may provide greater design flexibility with respect to the second semiconductor package 146. A substrate-type package, a lead frame-type package, etc., may be used for the second semiconductor package 146.

Figure 9:
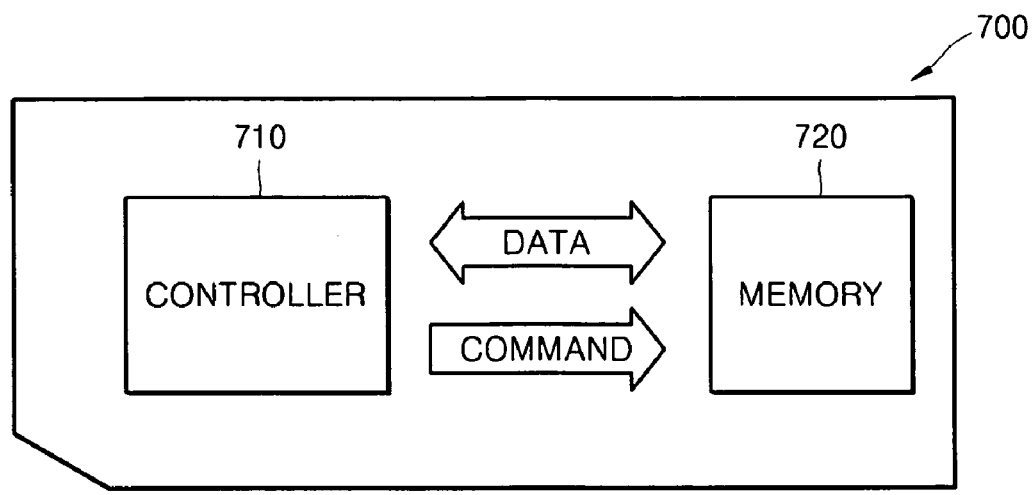
FIG. 9 illustrates an example memory card according to a ninth embodiment.

FIG. 9 illustrates an example memory card system 700, e.g., a multi-media card (MMC) or a secure digital (SD) card, according to a ninth embodiment. Referring to FIG. 9, the card 700 may include a controller 710 and a memory 720. The memory 720 may be, e.g., a flash memory, a PRAM, a DRAM, etc. An interface may be provided for exchanging data and commands (instructions) between the controller 710 and the memory 720. Another interface, e.g., a standard MMC or SD interface, may be provided for exchanging information with another device (not shown). The memory 720, the controller 710, and the interface therebetween may be packaged together as a multi-chip package (MCP). The memory 720, the controller 710, and/or the interface therebetween may be formed according to one or more of the embodiments described herein.

Figure 10:
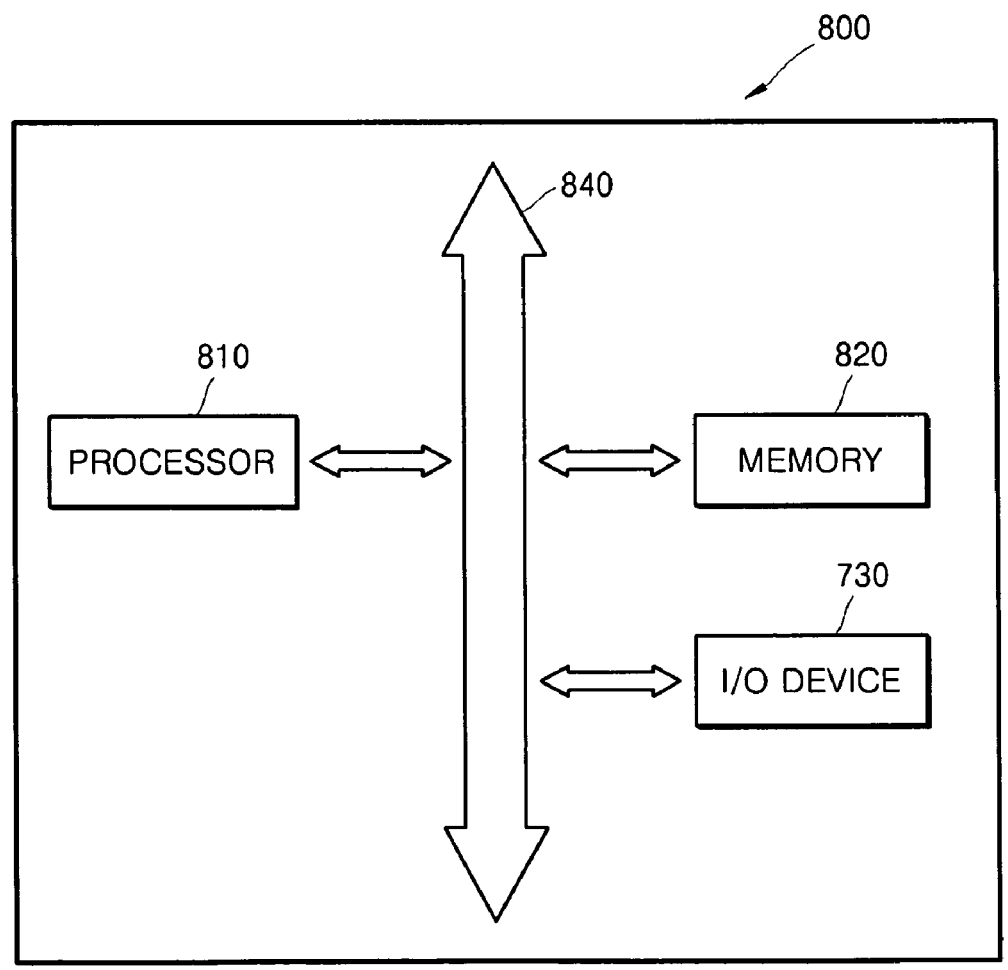
FIG. 10 illustrates an example electronic system according to a tenth embodiment.

FIG. 10 illustrates an example electronic system 800 according to a tenth embodiment. Referring to FIG. 10, the system 800 may include a processor 810, a memory 820, at least one I/O (input/output) device 830, and at least one bus 840. The system 800 may be, e.g., a mobile phone, an MP3 device, a navigation system, a solid state disk (SSD), a household appliance, etc. The I/O device 830 may be, e.g., a chipset coupled to the bus 840 and communicating with, e.g., a display, an input device such as a keypad, etc. The memory 820, the processor 810, the I/O device 830, and the bus 840 may be packaged together as an MCP. The memory 820, the processor 810, and/or the I/O device 830 may be formed according to one or more of the embodiments described herein. In an implementation, one, some, or all of the components (memory 820, the processor 810 and the I/O device 830) may be packaged together, e.g., they may be vertically stacked together as an MCP.

Figure 11:
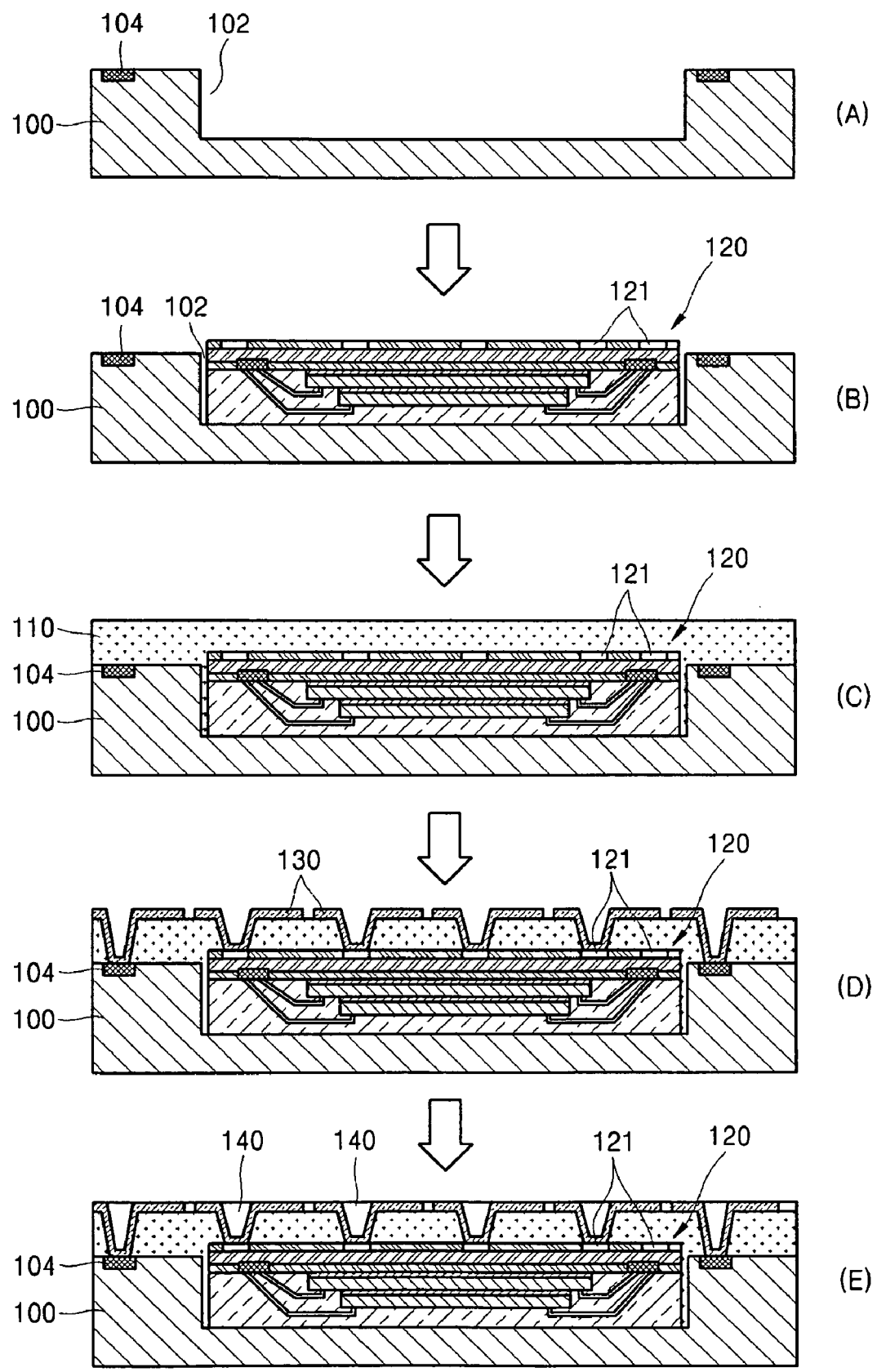
FIGS. 11A-E illustrate cross-sectional views of stages in an example method of fabricating a semiconductor package embedded in a substrate according to an eleventh embodiment.

FIGS. 11A-E illustrate cross-sectional views of stages in an example method of fabricating a semiconductor package embedded in a substrate according to an eleventh embodiment. Referring to FIG. 11A, the substrate 100 may be, e.g., a multilayer PCB having one or more circuit patterns 104 therein. The cavity 102 may be formed in the substrate 100 using, e.g., photolithography and etching, micromachining, etc. In an implementation (not shown), the substrate 100 may be processed to form the opening 106 therethrough, rather than the cavity 102. In this case, a layer covering the lower surface of the package 120 may be subsequently formed using, e.g., resin, solder resist, etc. Such an approach may be simpler than forming the cavity 102.

The cavity 102 may be sized to receive the semiconductor package 120. Lateral dimensions of the cavity 102 may be large enough to accommodate the semiconductor package 120, while the height of the cavity 102 may be greater than, lesser than, or equal to the height of the semiconductor package 120.

Referring to FIG. 11B, the semiconductor package 120 may be disposed in the cavity 102 in the substrate 100. In an implementation, the semiconductor package 120 may be tested before being combined with the substrate 100, e.g., using speed tests, etc., such that reliable performance of the semiconductor package 120 can be verified prior to assembly with the substrate 100.

The semiconductor package may be disposed such that the conductive pads 121 are oriented upwards, i.e., facing away from the cavity 102. In an implementation, the semiconductor package 120 may be bonded to the bottom surface of the cavity 102, e.g., using an adhesive material, a pre-preg material, a substrate raw material, a material used for the insulating layer 110, etc.

Referring to FIG. 11C, the semiconductor package and the substrate 100 may be covered with the insulating layer 110. In an implementation, the material used for the insulating layer 110 may also fill interstitial spaces between the semiconductor package 120 and the sidewalls of the cavity 102. In an implementation, the insulating layer 110 may be planarized to ensure a uniformly flat surface for subsequent operations. The material used for the insulating layer may be, e.g., BT resin.

Referring to FIG. 11D, openings, e.g., trenches, vias, etc., may be formed in the insulating layer 110 in accordance with a pattern of the metal layer 130, which is subsequently formed on the insulating layer 110. The openings may be formed using, e.g., photolithography and etching, micromachining, etc. The openings may expose portions of the circuit pattern 104 in the substrate 100 as well as the conductive pads 121 of the semiconductor package 120. The metal layer 130 may then be formed on the insulating layer 110. The metal layer 130 may be formed using, e.g., copper plating and patterning. The metal layer 130 may include members extending through the openings in the insulating layer 110 and contacting features, e.g., the wiring layer 104 and conductive pads 121, which are exposed by the openings.

Referring to FIG. 11E, the metal layer may be covered with, e.g., the solder resist 140. Subsequent operations (not shown) may be performed to couple the semiconductor package 120 to other components of an electronic system. For example, the metal layer 130 may be coupled to power sources and/or other integrated circuits in an electronic system such as a mobile phone, an MP3 device, a navigation system, a SSD, a household appliance, etc.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A device, comprising:
a base substrate;
a package including a die fixed to a package substrate, the package substrate electrically connected to the die, the die and the package substrate being encapsulated by an encapsulant in the package, the package at least partially embedded in the base substrate; and
a wiring portion on the package and extending across at least a portion of the base substrate adjacent to the package, wherein:
a wiring layer in the wiring portion is electrically connected to the package,
the base substrate has a cavity therein that is at least as large as the encapsulated die and package substrate,
the wiring portion further includes an insulating material disposed on the bottom surface of the package, the bottom surface facing away from the cavity, and
the insulating material is disposed in the cavity in a space between the encapsulated die and package substrate and the sidewalls of the base substrate.

2. The device as claimed in claim 1, wherein the package in a bottom-up orientation is embedded in the base substrate, such that an active side of the die faces away from the wiring portion, and
the wiring layer is electrically connected to bonding pads on the bottom of the package.

3. The device as claimed in claim 2, wherein the wiring portion includes:
a plurality of openings aligned with bonding pads on the bottom of the package, and
a conductive material disposed in the openings and electrically connecting the bonding pads to the wiring layer.

4. The device as claimed in claim 2, wherein the wiring portion includes:
a metal pattern electrically connecting bonding pads on the bottom of the package to the wiring layer, and
a solder resist covering the metal pattern, the solder resist forming an exposed surface of the device.

5. The device as claimed in claim 1, further comprising a least one wiring layer embedded in the base substrate below the wiring portion, the wiring portion electrically connecting the at least one wiring layer to the package.

6. The device as claimed in claim 1, further comprising another die in the package, the other die being stacked on the die and electrically connected to the wiring portion.

7. The device as claimed in claim 1, further comprising a second package embedded in the base substrate, wherein the wiring portion is electrically connected to the package and the second package.

8. The device as claimed in claim 1, further comprising a second package disposed between the wiring portion and the package.

9. The device as claimed in claim 1, further comprising another die disposed on the package.

10. The device as claimed in claim 9, wherein:
an insulation layer covers the other die and the package, and
a wiring pattern is formed on the insulation layer and is electrically connected to the other die and the package.

11. The device as claimed in claim 10, wherein the package includes a plurality of peripheral bonding pads in a peripheral region thereof, and
the other die is disposed in an area bounded by the peripheral bonding pads.

12. The device as claimed in claim 11, wherein the insulation layer includes openings aligned with the peripheral bonding pads, and
a conductive material is disposed in the openings and electrically connects the peripheral bonding pads to a wiring layer in the wiring portion.

13. The device as claimed in claim 9, wherein the wiring portion is between the other die and the package.

14. The device as claimed in claim 13, wherein the other die is connected to the wiring portion by bond wires attached to an upper side of the other die.

15. The device as claimed in claim 1, further comprising a second package, wherein:
the wiring portion is disposed between the second package and the package, and
the second package is connected to the wiring portion by solder bumps disposed on a lower side of the second package.

16. The device as claimed in claim 1, wherein:
the package is embedded in a cavity in the base substrate, and
the cavity has a height that is less than a height of the base substrate.

17. The device as claimed in claim 1, wherein:
the package is embedded in a cavity in the base substrate, and
the cavity extends through an entire thickness of the base substrate.

18. The device as claimed in claim 17, further comprising a layer on a lower side of the base substrate, the layer extending across the cavity so as to enclose a lower portion of the cavity.

19. A device, comprising:
a base substrate;
a package including a die fixed to a package substrate, the package substrate electrically connected to the die, the die and the package substrate being encapsulated by an encapsulant in the package, the package at least partially embedded in the base substrate;
a wiring portion on the package and extending across at least a portion of the base substrate adjacent to the package, and
another die disposed on the package, wherein:
an insulation layer covers the other die and the package,
a wiring pattern is formed on the insulation layer and is electrically connected to the other die and the package,
the package includes a plurality of peripheral bonding pads in a peripheral region thereof, and
the other die is disposed in an area bounded by the peripheral bonding pads.

* * * * *